US007209383B2

(12) United States Patent
Dray et al.

(10) Patent No.: US 7,209,383 B2
(45) Date of Patent: Apr. 24, 2007

(54) MAGNETIC RANDOM ACCESS MEMORY ARRAY HAVING BIT/WORD LINES FOR SHARED WRITE SELECT AND READ OPERATIONS

(75) Inventors: Cyrille Dray, Grenoble (FR); Christophe Frey, Meylan (FR); Jean Lasseuguette, Saint Martin d'Hères (FR); Sébastien Barasinski, Meylan (FR); Richard Fournel, Lumbin (FR)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 11/159,858

(22) Filed: Jun. 23, 2005

(65) Prior Publication Data

US 2005/0281080 A1    Dec. 22, 2005

Related U.S. Application Data

(63) Continuation-in-part of application No. 11/152,033, filed on Jun. 14, 2005.

(30) Foreign Application Priority Data

Jun. 16, 2004   (FR) .................................. 04 06532

(51) Int. Cl.
    *G11C 11/14*       (2006.01)
(52) U.S. Cl. .................................. 365/171; 365/230.06
(58) Field of Classification Search ................ 365/171, 365/230.06, 230.02
    See application file for complete search history.

(56) References Cited

U.S. PATENT DOCUMENTS 5,029,141 A    7/1991 Yoshimoto et al.

(Continued)

FOREIGN PATENT DOCUMENTS

EP    1 320 104    6/2003

(Continued)

OTHER PUBLICATIONS

Patent Abstracts of Japan, vol. 2000, No. 3, and JP 11 354728, Canon, Inc.

(Continued)

*Primary Examiner*—Vu A. Le
(74) *Attorney, Agent, or Firm*—Lisa K. Jorgenson; Andre M. Szuwalski

(57) ABSTRACT

A random access memory array includes random access memory elements arranged in a rows and columns. The elements of each row have a word line and a write digit line and the elements of each column have a bit line and a write bit line. A first selection circuit/transistor for each row has a first source-drain path coupled in the write digit line and a gate terminal coupled to the word line. A second selection circuit/transistor for each column has a second source-drain path coupling in the write bit line and a gate terminal coupled to the bit line. A first write signal is applied to one word line to actuate the first selection circuit/transistor for the row corresponding to that one word line and cause a write current to flow through the first source-drain path of the actuated first selection circuit/transistor and the corresponding write digit line to write data into certain memory elements in that row. A second write signal is applied to one bit line to actuate the second selection circuit/transistor for the column corresponding to that one bit line and cause a write current to flow through the second source-drain path of the actuated second selection circuit/transistor and the corresponding write bit line to write data into at least one memory element in that column.

30 Claims, 6 Drawing Sheets

U.S. PATENT DOCUMENTS

| | | | |
|---|---|---|---|
| 5,274,597 A | 12/1993 | Ohbayashi et al. | |
| 5,287,304 A | 2/1994 | Harward et al. | |
| 5,748,545 A | 5/1998 | Lee et al. | |
| 6,331,943 B1 | 12/2001 | Naji et al. | |
| 6,335,890 B1 | 1/2002 | Reohr et al. | |
| 6,532,163 B2 | 3/2003 | Okazawa | |
| 6,594,191 B2 | 7/2003 | Lammers et al. | |
| 6,639,834 B2 | 10/2003 | Sunaga et al. | |
| 6,714,442 B1* | 3/2004 | Nahas | 365/158 |
| 6,717,844 B1 | 4/2004 | Ohtani | |
| 6,778,429 B1 | 8/2004 | Lu et al. | |
| 6,778,434 B2 | 8/2004 | Tsuji | |
| 6,795,335 B2 | 9/2004 | Hidaka | |
| 6,829,162 B2 | 12/2004 | Hosotani | |
| 6,862,235 B2 | 3/2005 | Sakata et al. | |
| 6,891,742 B2 | 5/2005 | Takano et al. | |
| 6,894,918 B2 | 5/2005 | Sharma et al. | |
| 6,903,964 B2* | 6/2005 | Nahas et al. | 365/158 |
| 6,940,749 B2 | 9/2005 | Tsang | |
| 7,061,800 B2* | 6/2006 | Ooishi | 365/185.09 |
| 2002/0027803 A1 | 3/2002 | Matsui | |
| 2002/0034117 A1 | 3/2002 | Okazawa | |
| 2002/0064067 A1 | 5/2002 | Inui | |
| 2002/0080644 A1 | 6/2002 | Ito | |
| 2002/0176272 A1 | 11/2002 | DeBrosse et al. | |
| 2003/0026125 A1 | 2/2003 | Hidaka | |
| 2003/0058686 A1 | 3/2003 | Ooishi et al. | |
| 2004/0047204 A1 | 3/2004 | Hung et al. | |
| 2004/0052105 A1 | 3/2004 | Fulkerson et al. | |
| 2004/0125643 A1 | 7/2004 | Kang et al. | |
| 2004/0165424 A1 | 8/2004 | Tsang | |
| 2004/0208052 A1 | 10/2004 | Hidaka | |
| 2005/0180203 A1 | 8/2005 | Lin et al. | |
| 2005/0281080 A1 | 12/2005 | Dray et al. | |

FOREIGN PATENT DOCUMENTS

| | | |
|---|---|---|
| EP | 1 607 979 | 12/2005 |

OTHER PUBLICATIONS

Nahas, "A 4Mb 0.µm 1T1MTJ Toggle MRAM Memory," 2004 IEEE International Solid-State Circuits Conference, ISSCC 2004, Session 2, Non-Volatile Memory/2.3, 0-7803-8267-6, 2004.

European Search Report, EP 06 25 2950, dated Oct. 6, 2006.

* cited by examiner

MAGNETIC RANDOM ACCESS MEMORY ARRAY HAVING BIT/WORD LINES FOR SHARED WRITE SELECT AND READ OPERATIONS

CROSS-REFERENCE TO RELATED APPLICATION

This application is a Continuation-in-Part of U.S. application for patent Ser. No. 11/152,033, filed Jun. 14, 2005, entitled "Memory Architecture With Segmented Writing Lines" by Cyrille Dray, et al., the disclosure of which is hereby incorporated by reference.

BACKGROUND OF THE INVENTION

1. Technical Field of the Invention

The present invention relates to magnetic random access memories, and more particularly to a magnetic random access memory array architecture wherein the bit lines and/or the word lines are used not only during the element read operation but also to select the write bit line(s) and/or write digit line(s) during the element write operation.

2. Description of Related Art

A magnetic random access memory (MRAM) element typically has a structure that includes a first and second magnetic layers which are separated by a non-magnetic layer. A magnetic vector in one of the two magnetic layers is magnetically fixed or pinned, while the magnetic vector of the other of the two magnetic layers is not fixed and thus its magnetization direction is free to be controlled and switched. Information is written to and read from the element as a logic "1" or a logic "0" (i.e., one or the other of two possible logic states) by changing the direction of the non-fixed magnetization vector in the other of the two magnetic layers. The differences in magnetization vector direction cause resistance variations within the element which can be measured. For example, the shifting of the magnetization vector direction can represent two different resistances or potentials, which are then read by the memory circuit as either a logic "1" or a logic "0." The detection of these resistance or potential differences due to shifting magnetization vector direction allows information to be written to and read from the MRAM element.

Reference is now made to FIGS. 1A and 1B wherein there are shown schematic diagrams of conventional MRAM elements 10. Each element includes a bit line 12 and a word line 14. The memory storing structure of the element 10 is referred to as a "magnetic tunnel junction" 16 (MTJ) which is represented in the schematic by a variable resistance and is physically composed of the first and second magnetic layers and the separating non-magnetic layer discussed above.

With reference to FIG. 1A, one end of this resistance is connected to the bit line 12. The other end of the resistance is connected to a conduction terminal of an access transistor 18. The access transistor 18 in the illustrated element 10 is an n-channel FET with its source conduction terminal connected to ground and its drain conduction terminal connected to the other end of the resistance. The gate terminal of the access transistor 18 is connected to the word line 14.

With reference to FIG. 1B, one end of this resistance is connected to a reference voltage (for example, a ground reference). The other end of the resistance is connected to a conduction terminal of an access transistor 18. The access transistor 18 in the illustrated element 10 is an n-channel FET with its source conduction terminal connected to the bit line 12 and its drain conduction terminal connected to the other end of the resistance. The gate terminal of the access transistor 18 is connected to the word line 14.

In either of the embodiments of FIGS. 1A and 1B, a write bit line 22 (WBL) and a write digit line 24 (WDL) for the element 10 intersect at the magnetic tunnel junction 14. These lines 22 and 24 selectively carry currents and thus each selectively create a magnetic flux proximate to the magnetic tunnel junction 16. The magnetic fields induced by current flow in the lines 22 and 24 can be used to set the non-fixed direction of the magnetic vector within the magnetic tunnel junction 16. As discussed above, the setting of this direction affects the resistance of the magnetic tunnel junction 16. By selectively choosing the current flow in the lines 22 and 24, one can program the magnetic tunnel junction 16, through its varying resistance, to store either one of two logic states: a logic "1" or a logic "0." It is recognized, however, that the current in both the lines 22 and 24 must be of a certain magnitude in order to effectively control the non-fixed direction of the magnetic vector within the magnetic tunnel junction 16. It is accordingly imperative that sufficient current be made available in both lines 22 and 24 in order to write information into the element 10.

Reference is now made to FIG. 2 wherein there is shown a block diagram of a conventional MRAM memory array 50. The array 50 includes a plurality of individual MRAM elements 10 (of any suitable type including either of those shown in FIGS. 1A and 1B) arranged in a N×M array format. Each column 52 of elements 10 in the array 50 includes a bit line 12 and a write bit line 22. Each row 54 of elements 10 in the array 50 includes a word line 14 and a write digit line 24. Selection of a write digit line 24 and write bit line 22, along with the application of appropriate currents thereto, results in the writing of an information bit to the element 10 in the array 50 where the selected write digit line and write bit line intersect. Selection of a bit line 12 and a word line 14 turns on the access transistor 18 located at the intersection of the selected bit line(s) and word line, and causes a current to flow through the magnetic tunnel junction 16 resistance whose magnitude is dependent on the programmed non-fixed direction of the magnetic vector within the magnetic tunnel junction. A sense amplifier (not shown) that is connected to each selected bit line 12 measures the current flowing in the bit line, as affected by the current flowing through the magnetic tunnel junction 16 resistance, in order to "read" the logic state of the element 10.

The write bit lines 22 and write digit lines 24 which extend across the columns and rows, respectively, of the array 50 are coupled between first and second reference voltages (for example, a positive voltage and ground) through a plurality of selection transistors 62 and 64. A column decoder 72 receives address information over an address bus 58 and selects a plurality of columns in the array for the address and applies control signals, as dictated by the data to be written to the array, to the selection transistors 62 associated with those columns. Similarly, a row decoder 74 receives address information over an address bus 68 (perhaps the same as bus 58) and selects a row of the array for the address and applies a control signal to the selection transistor 64 associated with that row. Responsive to the selection signals appropriate currents are generated (or not generated) in the write bit lines 22 and write digit line 24 at the addressed elements 10 in the memory array to program the magnetic vectors of the addressed elements to store the data to be written to the array.

SUMMARY OF THE INVENTION

A random access memory array includes random access memory elements arranged in a rows and columns. The elements of each row have a word line and a write digit line and the elements of each column have a bit line and a write bit line. A first selection transistor for each row has a first source-drain path coupled in the write digit line and a gate terminal coupled to the word line. A second selection transistor for each column has a second source-drain path coupling in the write bit line and a gate terminal coupled to the bit line.

In accordance with one implementation, a first write signal is applied to one word line to actuate the first selection transistor for the row corresponding to that one word line and cause a write current to flow through the first source-drain path of the actuated first selection transistor and the corresponding write digit line to write data into certain memory elements in that row.

In accordance with another implementation, a second write signal is applied to one bit line to actuate the second selection transistor for the column corresponding to that one bit line and cause a write current to flow through the second source-drain path of the actuated second selection transistor and the corresponding write bit line to write data into at least one memory element in that column.

In accordance with another embodiment, a magnetic random access memory array comprises a plurality of rows and columns of magnetic random access memory elements, the elements of each row having a word line and a write digit line and the elements of each column having a bit line and a write bit line. A selection transistor for each column has a source-drain path coupled in the write bit line and a gate terminal coupled to the bit line.

In accordance with another implementation of the invention, each bit line is a segmented bit line comprised of a global bit line and a plurality of local bit lines and each write bit line is a segmented write bit line comprised of a global write bit line and a plurality of local write bit lines. A write bit line selection transistor in this implementation operates to select one of the local write bit lines.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1A:
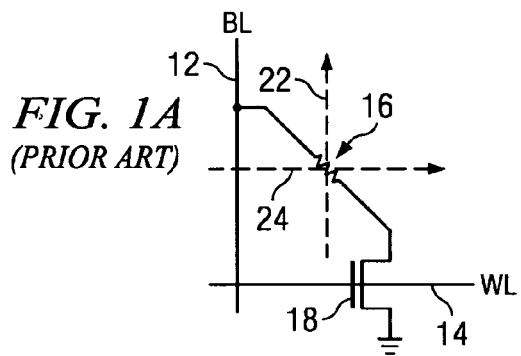
FIGS. 1A and 1B are schematic diagrams of prior art magnetic random access memory (MRAM) elements.
Figure 1B:
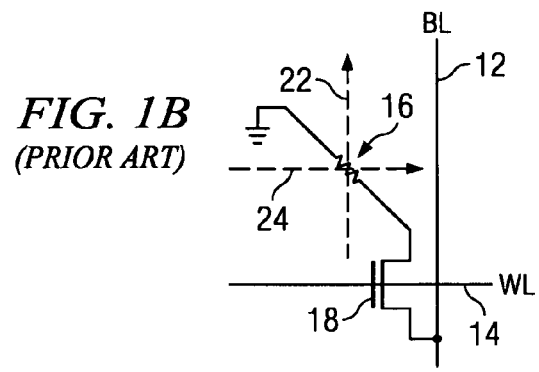
Figure 3:
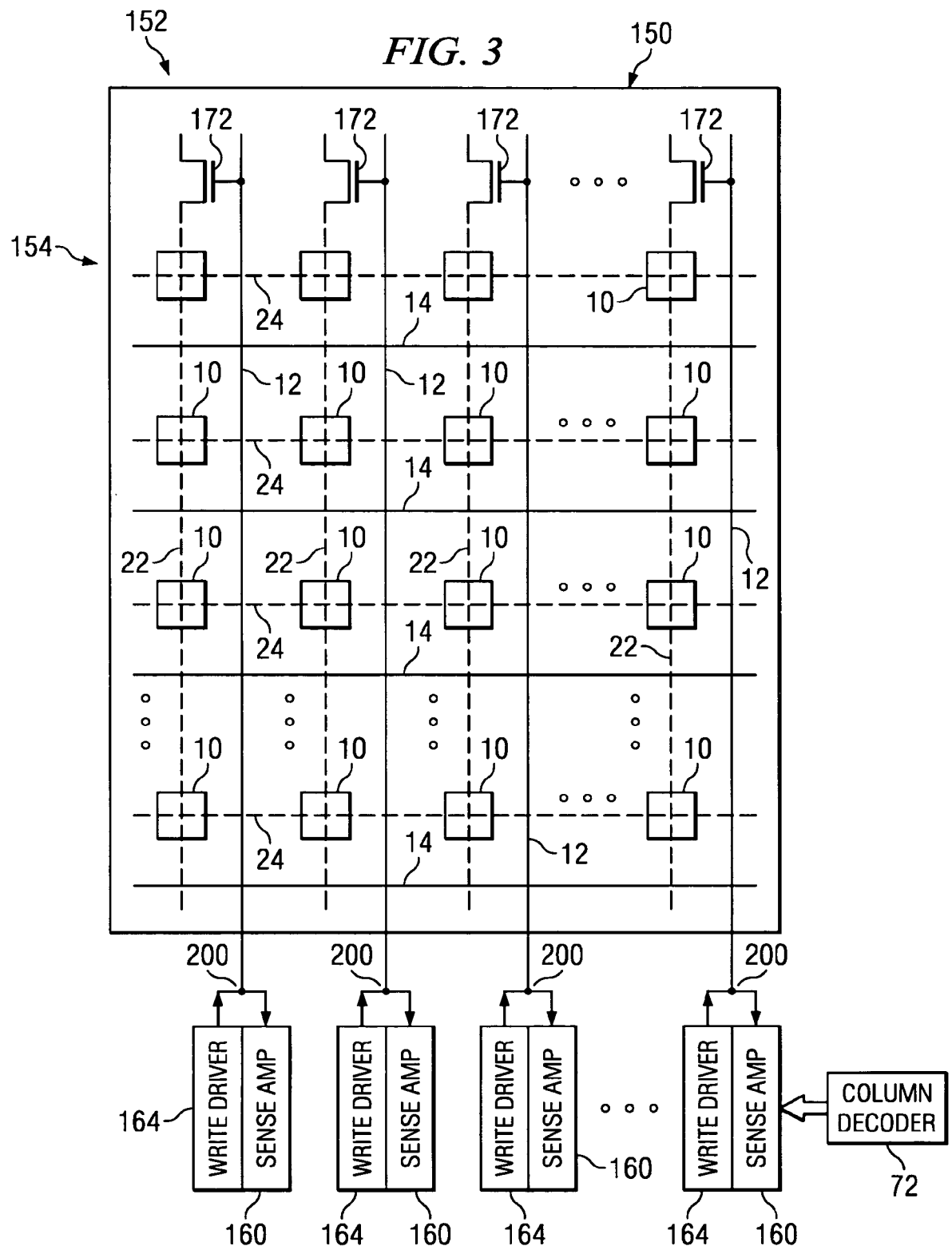
FIG. 3 is a block diagram of an MRAM memory array in accordance with a first embodiment of the present invention.

Reference is now made to FIG. 3 wherein there is shown a block diagram of an MRAM memory array 150 in accordance with a first embodiment of the present invention. The array 150 includes a plurality of individual MRAM elements 10 (of any suitable type including either of those shown in FIGS. 1A and 1B) arranged in a N×M array format. The array 150 includes a plurality of columns 152 and rows 154 populated with an individual element 10 located at each row/column intersection point. Each column 152 of elements 10 in the array 150 includes a bit line 12 and a write bit line 22. Similarly, each row 154 of elements 10 in the array includes a word line 14 and a write digit line 24.

Figure 2:
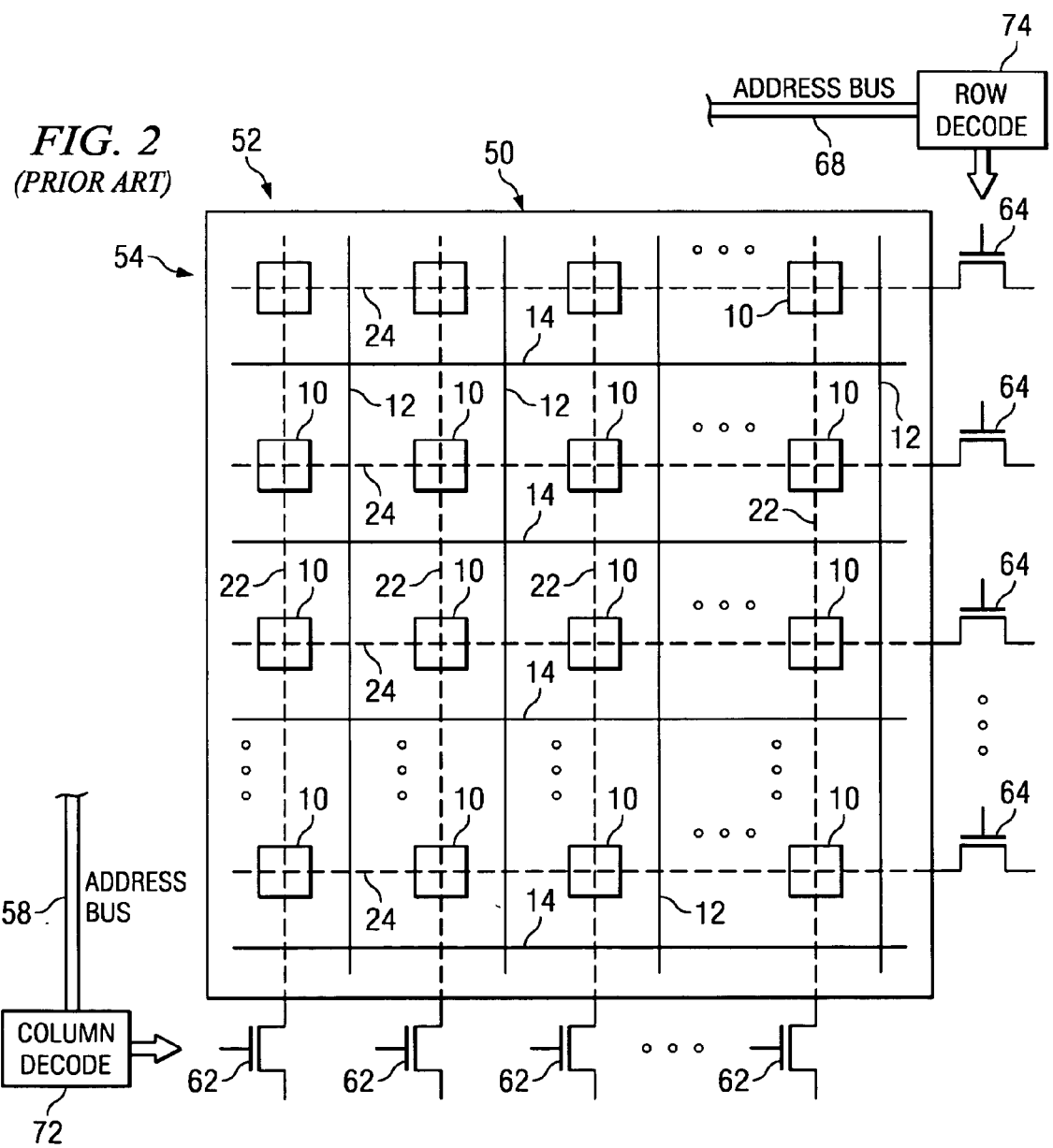
FIG. 2 is a block diagram of a conventional MRAM memory array.

Each bit line 12 is coupled to both a sense amplifier 160 and to a write driver 164. Each bit line 12 is further coupled to the gate terminal of a selection transistor 172 whose source/drain path is coupled to the write bit line 22 of the element 10 to which the bit line 12 is associated. In this configuration, the bit line 12 serves in one mode to carry the read data signal from the element 10 to the sense amplifier 160, and in another mode to control selection of the write bit line 22 by the write driver 164 to write data into the element 10. This common read/write operation mode coupling to the bit line 12 is permitted as the array 150 does not operate in read mode and write mode at the same time. The connections of the sense amplifier 160 and write driver 164 to the bit line 12 can be switched, controlled impedance and/or tri-stated so as to isolate the circuits in the two operational modes from each other. Control over operation of the write digit lines 24 is made in this embodiment in accordance with conventional circuits (such as those illustrated in FIG. 2). Column/row selections are made using conventional column decoder 72 and row decoder 74 circuits (see, FIGS. 2 and 5).

It will be understood by those skilled in the art that it may not be desirable to use a transistor device for the selection transistor 172 of FIG. 3. One reason for this is that a transistor device can have an undesirably large gate to drain/source capacitance. Use of such a device could adversely affect memory speed. Another reason is that the control signal could change, and thus cause an incorrect or inadvertent write operation to occur during a read. Thus, the selection transistor 172 should be viewed in a symbolic manner as representing an enabled selection circuit which in a preferred embodiment would include sufficient buffering of the signal so as to address capacitance issues and maintain memory speed. Such enabled bit line selection circuits are well known to those skilled in the art.

Figure 4:
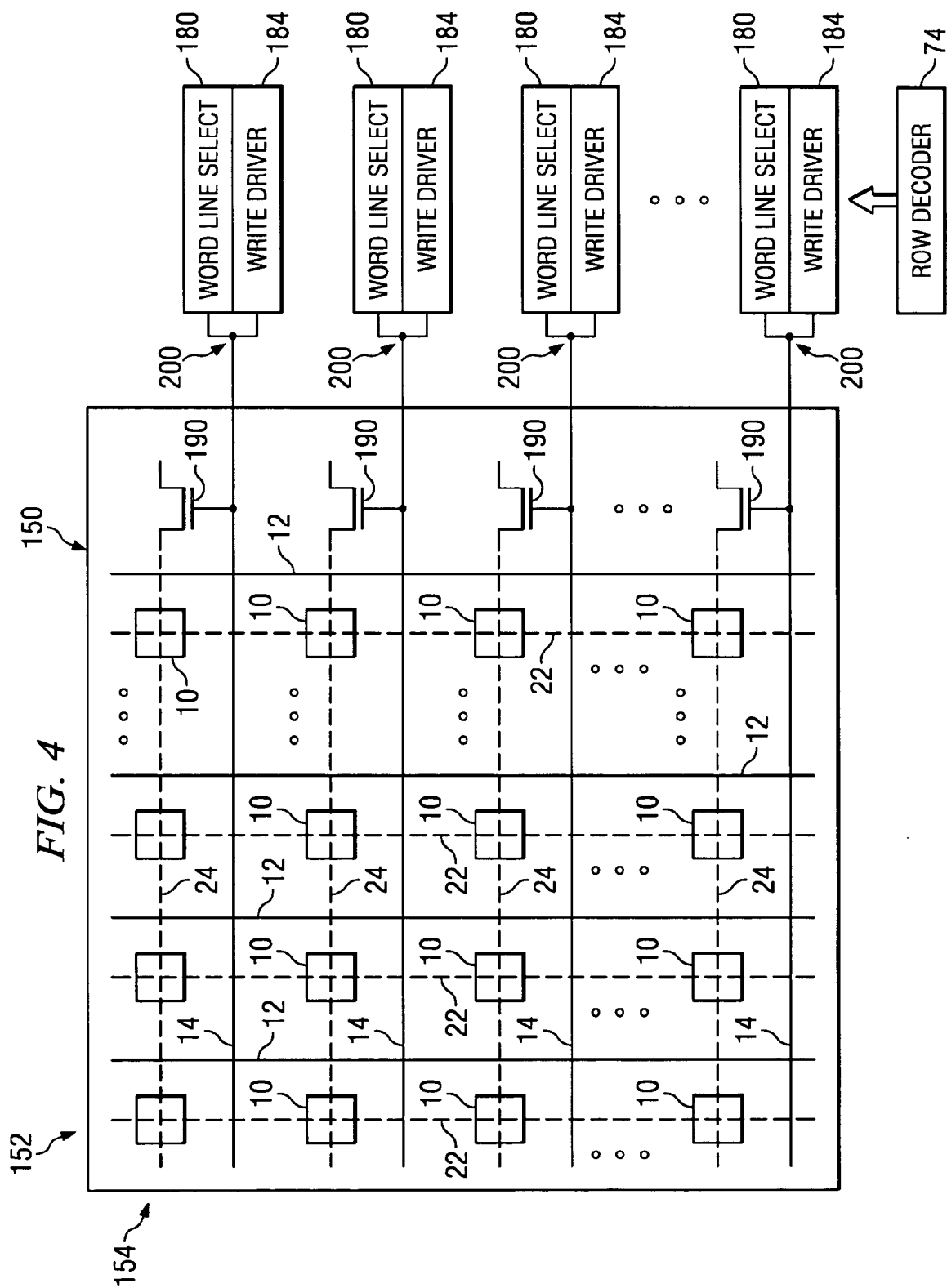
FIG. 4 is a block diagram of an MRAM memory array in accordance with a second embodiment of the present invention.

Reference is now made to FIG. 4 wherein there is shown a block diagram of an MRAM memory array 150 in accordance with a second embodiment of the present invention. The array 150 includes a plurality of individual MRAM elements 10 (of any suitable type including either of those shown in FIGS. 1A and 1B) arranged in a N×M array format. The array 150 includes a plurality of columns 152 and rows 154 populated with an individual element 10 located at each row/column intersection point. Each column 152 of elements 10 in the array 150 includes a bit line 12 and a write bit line 22. Similarly, each row 154 of elements 10 in the array includes a word line 14 and a write digit line 24.

Each word line 14 is coupled to both a word line select circuit 180 and to a write driver 184. Each word line 14 is further coupled to the gate terminal of a selection transistor 190 whose source/drain path is coupled to the write digit line 24 of the element 10 to which the word line 14 is associated. In this configuration, the word line 14 serves in one mode to carry the word line selection signal to the element 10 when reading, and in another mode to control selection of the write digit line 24 by the write driver 184 to write data into the element 10. This common read/write operation mode coupling to the word line 14 is permitted as the array 150 does not operate in read mode and write mode at the same time. The connections of the word line select circuit 180 and write driver 184 to the word line 14 can be switched, controlled impedance and/or tri-stated so as to isolate the circuits in the two operational modes from each other. Control over operation of the write bit lines 22 is made in this embodiment in accordance with conventional circuits (such as those illustrated in FIG. 2). Column/row selections are made using conventional column decoder 72 and row decoder 74 circuits (see, FIGS. 2 and 5).

It will be understood by those skilled in the art that it may not be desirable to use a transistor device for the selection transistor 190 of FIG. 4. One reason for this is that a transistor device can have an undesirably large gate to drain/source capacitance. Use of such a device could adversely affect memory speed. Another reason is that the control signal could change, and thus cause an incorrect or inadvertent write operation to occur during a read. Thus, the selection transistor 190 should be viewed in a symbolic manner as representing an enabled selection circuit which in a preferred embodiment would include sufficient buffering of the signal so as to address capacitance issues and maintain memory speed. Such enabled word line selection circuits are well known to those skilled in the art.

Figure 5:
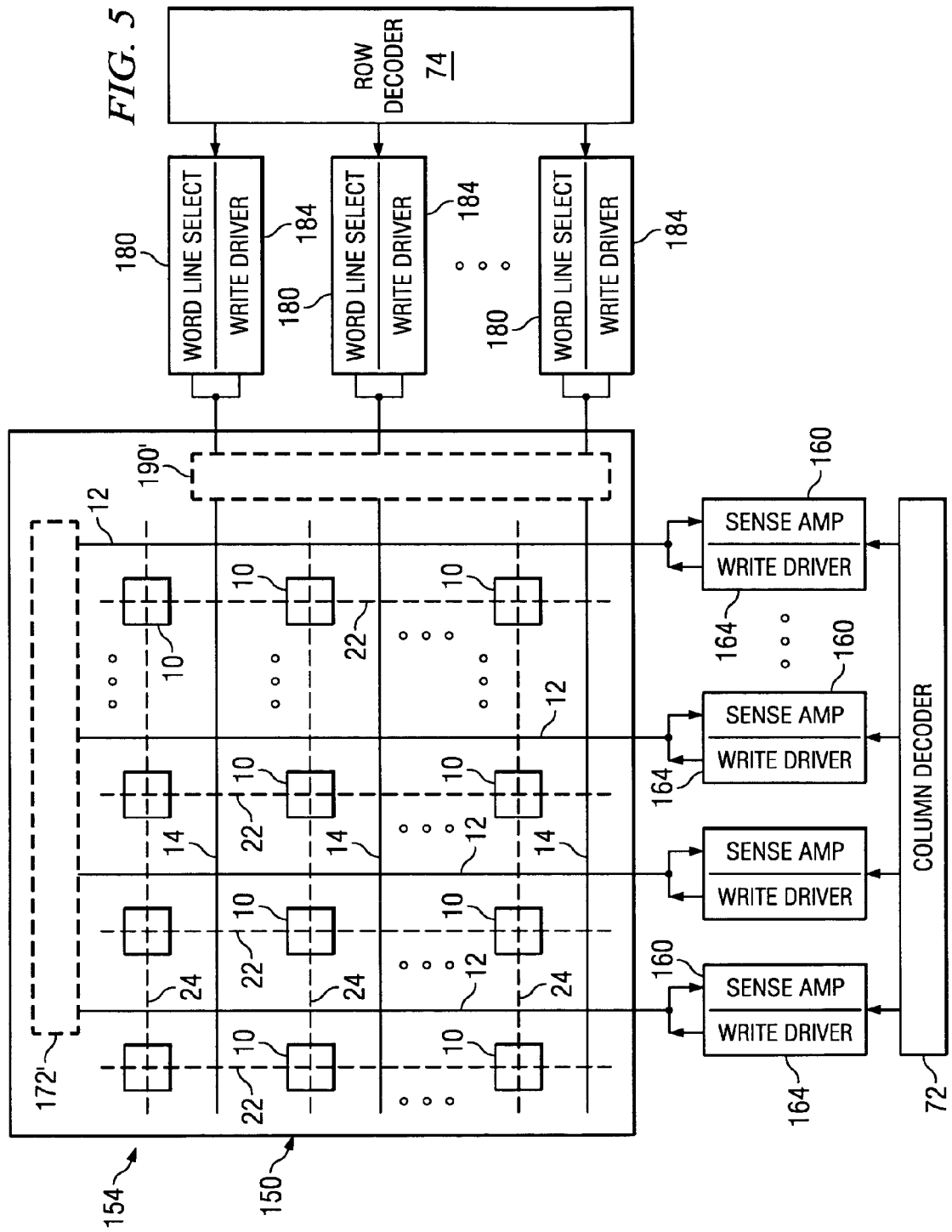
FIG. 5 is a block diagram of an MRAM memory array in accordance with a third embodiment of the present invention.

Reference is now made to FIG. 5 wherein there is shown a block diagram of an MRAM memory array 150 in accordance with a third embodiment of the present invention. Like reference numbers refer to like or similar parts in FIGS. 3 and 4. In this third embodiment, the array 150 is provided with both common read/write operation circuits as illustrated in FIGS. 3 and 4. The individual selection transistors 172 and 190 (note discussion above regarding symbolic representation of selection circuits) are not explicitly illustrated but their presence is designated by the dotted reference boxes labeled 172' and 190'. Thus, both the bit line 12 and the word line 14 can be used not only in commonly understood operations to read data from an element, but also in write mode to select the write bit line 22 and write digit line 24, respectively, when writing data into an element 10 of the array 150. Column/row selections are made using conventional column decoder 72 and row decoder 74 circuits.

Figure 6:
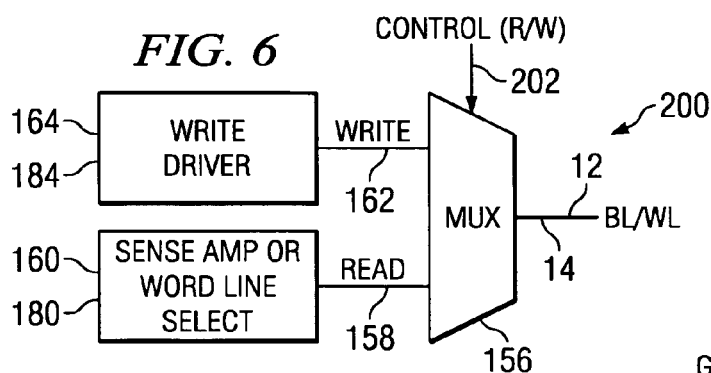
FIG. 6 is a block diagram of a circuit for additionally coupling a write drive to a bit/word line in the embodiments of FIGS. 3–5.

Reference is now made to FIG. 6 wherein there is shown a block diagram of a circuit 200 for use in additionally coupling a write driver to a bit/word line 12/14 in the embodiments of FIGS. 3–5. The circuit 200 is equally applicable to either the bit line 12 or word line 14. The bit/word line 12/14 is coupled to one end of a multiplexer 156. On an opposite side of the multiplexer 156, a first line 158 is coupled to the appropriate read circuitry (such as, for example, a sense amplifier 160 or word line select circuit 180). A second line 162 on the opposite side of the multiplexer 156 is coupled to the appropriate write driver circuit (such as, for example, the write driver 164, for a bit line 12 implementation, and the write driver 184, for a word line 14 implementation). The multiplexer 156 receives a control signal 202 which selects which of the first line 158 or second line 162 is connected to the bit/word line 12/14. The control signal 202 may be derived from the read/write operational mode of the array 150.

Figure 7:
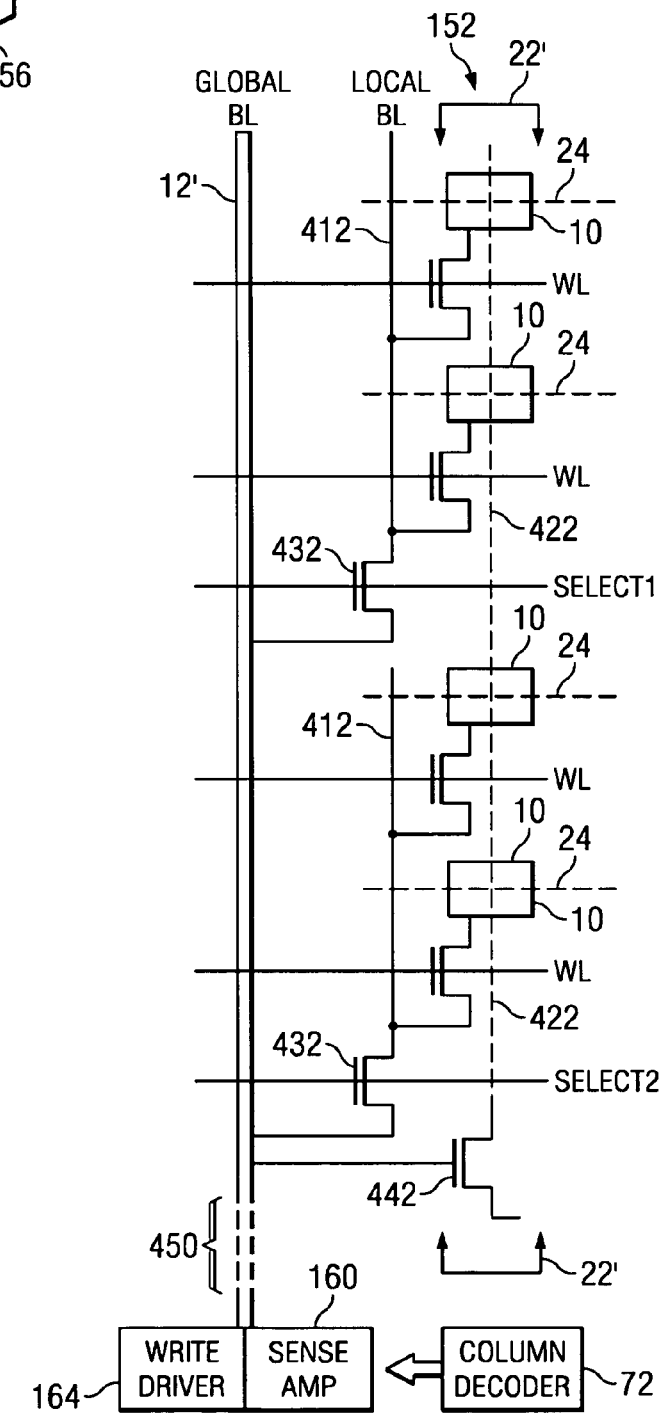
FIG. 7 is a diagram of an embodiment of the invention utilizing a segmented column structure.

In FIGS. 3–5, the bit line 12, word line 14, write bit line 22 and write digit line 24 are all illustrated as being unitary. In an alternative embodiment of the invention, segmented lines can instead be used. For example, reference is now made to FIG. 7 wherein there is shown an embodiment of the invention utilizing a segmented column structure. FIG. 7 illustrates only a small portion of the array 150 (representing a portion of one column 152). In the illustrated portion, the bit line 12 has been segmented into a plurality of local bit lines 412. Similarly, the write bit line 22 has been segmented into a plurality of local write bit lines 422. In this instance, the illustrated local write bit line 422 is shown spanning the area of two local bit lines 412, but it will be understood that a one-to-one correspondence between local bit lines 412 and local write bit lines 422 may be provided if desired. A global bit line 12' and global write bit line 22' are also provided. The global bit line 12' runs the length of the column and is connected to each local bit line 412 in the column through the source-drain path of a selection transistor 432. The global write bit line 22' provides one of two reference voltages for each of the local write bit lines 422. In a preferred embodiment of the invention, the global write bit line 22' comprises a metal layer which overlies the column of cells 10 and each of the included local write bit lines 422. A selection circuit/transistor 442 is provided for each local write bit line 422. A source-drain path of the selection circuit/transistor 442 completes the circuit connection of the local write bit line 422 between the two reference voltages. A gate terminal of the selection circuit/transistor 442 is connected to the global bit line 12' so as to allow the global bit line 12' to function not only in read mode but also in write mode as described above. More generally, it will be noted that the selection between local and global can be accomplished by switching source and gate of circuit/transistor 442 or by replacing the circuit/transistor 442 by any logic selection circuit (such as, for example, a CMOS path gate, a multiplexer, or other suitable circuitry). Reference 450 designates extension of the global bit line 12' along the length of the column 152 and replication of the structures illustrated along that length. The global bit line 12' is connected to both the sense amplifier 160 circuitry (for use when the global bit line 12' reads data from a selected cell 10) and the write driver 164 circuitry (for use when the global bit line transfers a write selection signal to one or more of the circuit/transistor 442 in the column 152 so as to write data to selected cell(s) 10).

Figure 8:
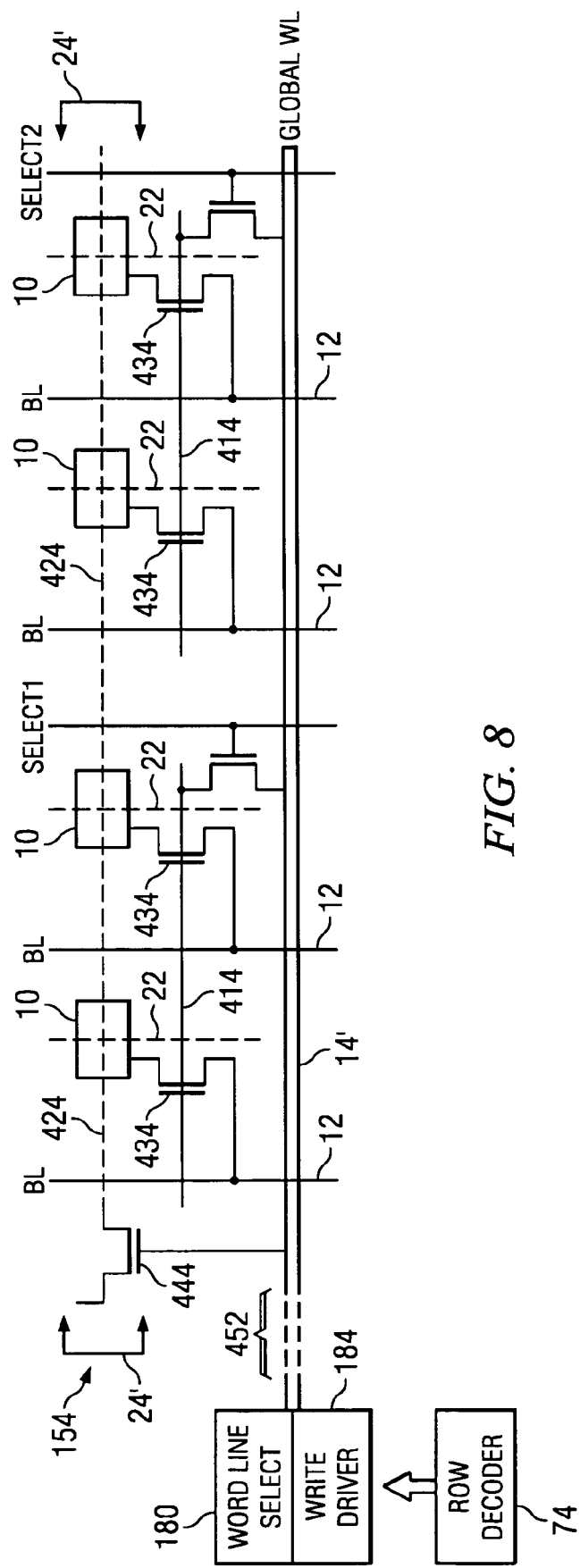
FIG. 8 is a diagram of an embodiment of the invention utilizing a segmented row structure.

Reference is now made to FIG. 8 wherein there is shown an embodiment of the invention utilizing a segmented row structure. FIG. 8 illustrates only a small portion of the array 150 (representing a portion of one row 154). In the illustrated portion, the word line 14 has been segmented into a plurality of local word lines 414. Similarly, the write digit line 24 has been segmented into a plurality of local write digit lines 424. In this instance, the illustrated local write digit line 424 is shown spanning the area of two local word lines 414, but it will be understood that a one-to-one correspondence between local word lines 414 and local write digit lines 424 may be provided if desired. A global word line 14' and global write digit line 24' are also provided. The global word line 14' runs the length of the row 154 and is connected to each local word line 414 in the row through the source-drain path of a selection circuit/transistor 434. The global write digit line 24' provides one of two reference voltages for each of the local write digit lines 424. In a preferred embodiment of the invention, the global write digit line 24' comprises a metal layer which overlies the row of cells 10 and each of the included local write digit lines 424. A selection circuit/transistor 444 is provided for each local write digit line 424. A source-drain path of the selection circuit/transistor 444 completes the circuit connection of the local write digit line 424 between the two reference voltages. A gate terminal of the selection circuit/transistor 444 is connected to the global word line 14' so as to allow the global word line 14' to function not only in read mode but also in write mode as described above. Reference 452 designates extension of the global word line 14' along the length of the column 154 and replication of the structures illustrated along that length. The global word line 14' is connected to both the word line select 180 circuitry (for use when the global word line 14' selects cells 10 for a read) and the write driver 184 circuitry (for use when the global word line transfers a write selection signal to one or more of the transistors 444 in the row 154 so as to write data to selected cell(s) 10).

Reference is now once again made to FIG. 5. Although FIGS. 7 and 8 illustrate separate use of segmented lines with respect to columns 152 and row 154 of the array 150, it will be understood with reference to FIG. 5 that segmented bit lines 412/segmented write bit lines 422 and segmented word lines 414/segmented write digit lines 424 can both be used with respect to the same array 150. Thus, both the global bit line 12' and the global word line 14' can be used not only in commonly understood operations to read data from an element, but also in write mode to select certain one or ones of the segmented write bit lines 422 and segmented write digit lines 424, respectively, when writing data into an element 10 of the array 150. Column/row selections are made using conventional column decoder 72 and row decoder 74 circuits.

The terms "connected" or "coupled" as used herein do not necessarily require a direct connection among and between the recited components. Rather, it will be appreciated by those skilled in the art that the Figures are illustrative and indirect connections or couplings through other components or devices is possible without detracting from the operation of the invention.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A magnetic random access memory array, comprising:
   a plurality of rows and columns of magnetic random access memory elements, the elements of each row having a word line and a write digit line and the elements of each column having a bit line and a write bit line;
   a first selection circuit for each row having a first source-drain path coupled in the write digit line and a gate terminal coupled to the word line; and
   a second selection circuit for each column having a second source-drain path coupling in the write bit line and a gate terminal coupled to the bit line.

2. The array of claim 1 further comprising:
   a write driver circuit coupled to the word line; and
   a word line select circuit coupled to the word line.

3. The array of claim 2 further comprising:
   a multiplexer having first and second ports on a first side coupled to the write driver circuit and the word line select circuit, respectively, and a third port on a second side coupled to the word line.

4. The array of claim 3 further including a multiplexer selection signal coupled to the multiplexer for selectively connecting the first/second ports to the third port in response to a write/read signal.

5. The array of claim 4 wherein the write/read signal is derived from a write/read operational mode of the array.

6. The array of claim 1 further comprising:
   a write driver circuit coupled to the bit line; and
   a sense amplifier circuit coupled to the bit line.

7. The array of claim 6 further comprising:
   a multiplexer having first and second ports on a first side coupled to the write driver circuit and the sense amplifier circuit, respectively, and a third port on a second side coupled to the bit.

8. The array of claim 7 further including a multiplexer selection signal coupled to the multiplexer for selectively connecting the first/second ports to the third port in response to a write/read signal.

9. The array of claim 8 wherein the write/read signal is derived from a write/read operational mode of the array.

10. The array of claim 1 further comprising:
    a first write driver circuit coupled to the word line;
    a word line select circuit coupled to the word line;
    a second write driver circuit coupled to the bit line; and
    a sense amplifier circuit coupled to the bit line.

11. The array of claim 10, further comprising:
    a first multiplexer having first and second ports on a first side coupled to the write driver circuit and the word line select circuit, respectively, and a third port on a second side coupled to the word line; and
    a second multiplexer having first and second ports on a first side coupled to the write driver circuit and the sense amplifier circuit, respectively, and a third port on a second side coupled to the bit.

12. The array of claim 11 further comprising:
    a first multiplexer selection signal coupled to the first multiplexer for selectively connecting the first/second ports to the third port in response to a first write/read signal; and
    a second multiplexer selection signal coupled to the second multiplexer for selectively connecting the first/second ports to the third port in response to a second write/read signal.

13. The array of claim 12 wherein the first and second write/read signals are derived from a write/read operational mode of the array.

14. The array of claim 1, wherein:
    a first write signal applied to one word line actuates the first selection circuit for the row corresponding to that one word line and causes a write current to flow through the first source-drain path of the actuated first selection circuit and the corresponding write digit line to write data into certain memory elements in that row.

15. The array of claim 1, wherein:
    a second write signal applied to one bit line actuates the second selection circuit for the column corresponding to that one bit line and causes a write current to flow through the second source-drain path of the actuated second selection circuit and the corresponding write bit line to write data into at least one memory element in that column.

16. The array of claim 1 wherein each word line is a segmented word line comprised of a global word line and a plurality of local word lines.

17. The array of claim 1 wherein each write digit line is a segmented write digit line comprised of a global write digit line and a plurality of local write digit lines, the first selection circuit for selecting one of the local write digit lines.

18. The array of claim 1 wherein each word line is a segmented word line comprised of a global word line and a plurality of local word lines and wherein each write digit line is a segmented write digit line comprised of a global write digit line and a plurality of local write digit lines, the first selection circuit for selecting one of the local write digit lines.

19. The array of claim 1 wherein each bit line is a segmented bit line comprised of a global bit line and a plurality of local bit lines.

20. The array of claim 1 wherein each write bit line is a segmented write bit line comprised of a global write bit line and a plurality of local write bit lines, the second selection circuit for selecting one of the local write bit lines.

21. The array of claim 1 wherein each bit line is a segmented bit line comprised of a global bit line and a plurality of local bit lines and wherein each write bit line is a segmented write bit line comprised of a global write bit line and a plurality of local write bit lines, the second selection circuit for selecting one of the local write bit lines.

22. A magnetic random access memory array, comprising:
   a plurality of rows and columns of magnetic random access memory elements, the elements of each row having a word line and a write digit line and the elements of each column having a bit line and a write bit line; and
   a selection circuit for each column having a source-drain path coupled in the write bit line and a gate terminal coupled to the bit line.

23. The array of claim 22 further comprising:
   a write driver circuit coupled to the bit line; and
   a sense amplifier circuit coupled to the bit line.

24. The array of claim 23 further comprising:
   a multiplexer having first and second ports on a first side coupled to the write driver circuit and the sense amplifier circuit, respectively, and a third port on a second side coupled to the bit line.

25. The array of claim 24 further including a multiplexer selection signal coupled to the multiplexer for selectively connecting the first/second ports to the third port in response to a write/read signal.

26. The array of claim 25 wherein the write/read signal is derived from a write/read operational mode of the array.

27. The array of claim 22, wherein:
   a write signal applied to one bit line actuates the selection circuit for the column corresponding to that one bit line and causes a write current to flow through the source-drain path of the actuated selection circuit and the corresponding write bit line to write data into certain memory elements in that column.

28. The array of claim 22 wherein the bit line is a segmented bit line comprised of a global bit line and a plurality of local bit lines.

29. The array of claim 22 wherein the write bit line is a segmented write bit line comprised of a global write bit line and a plurality of local write bit lines, the selection circuit for selecting one of the local write bit lines.

30. The array of claim 22 wherein the bit line is a segmented bit line comprised of a global bit line and a plurality of local bit lines and the write bit line is a segmented write bit line comprised of a global write bit line and a plurality of local write bit lines, the selection circuit for selecting one of the local write bit lines.

* * * * *